US008988103B2

(12) United States Patent
Liu

(10) Patent No.: US 8,988,103 B2
(45) Date of Patent: Mar. 24, 2015

(54) CAPACITIVELY COUPLED LOGIC GATE

(76) Inventor: David K. Y. Liu, Fremont, CA (US)

( * ) Notice: Subject to any disclaimer, the term of this patent is extended or adjusted under 35 U.S.C. 154(b) by 83 days.

(21) Appl. No.: 13/233,767

(22) Filed: Sep. 15, 2011

(65) Prior Publication Data

US 2012/0062276 A1    Mar. 15, 2012

Related U.S. Application Data

(60) Provisional application No. 61/383,128, filed on Sep. 15, 2010.

(51) Int. Cl.
H03K 19/23      (2006.01)
H01L 27/115     (2006.01)
H01L 27/118     (2006.01)

(52) U.S. Cl.
CPC .......... *H03K 19/23* (2013.01); *H01L 27/11517* (2013.01); *H01L 27/11803* (2013.01)
USPC .................. 326/36; 326/11; 326/35; 326/104

(58) Field of Classification Search
CPC    H03K 19/23; H03K 19/0813; H03K 17/6872
USPC ............. 326/93, 95–98, 104–108, 121, 9–11, 326/35–36
See application file for complete search history.

(56) References Cited

U.S. PATENT DOCUMENTS

| | | | |
|---|---|---|---|
| 4,412,311 A | 10/1983 | Miccoli et al. | |
| 5,021,999 A | 6/1991 | Kohda et al. | |
| 5,548,146 A | 8/1996 | Kuroda et al. | |
| 5,586,073 A | 12/1996 | Hiura et al. | |
| 5,712,816 A | 1/1998 | Cappelletti et al. | |
| 6,441,443 B1 | 8/2002 | Hsu et al. | |
| 6,456,992 B1* | 9/2002 | Shibata et al. | 706/33 |
| 6,470,328 B1* | 10/2002 | Varshavsky | 706/33 |
| 6,489,202 B1 | 12/2002 | Hsu et al. | |
| 6,501,685 B2 | 12/2002 | Hsu et al. | |
| 6,510,193 B1* | 1/2003 | Kochi et al. | 377/60 |
| 6,528,842 B1* | 3/2003 | Luich et al. | 257/315 |
| 6,631,087 B2 | 10/2003 | Di Pede et al. | |
| 6,678,190 B2 | 1/2004 | Yang et al. | |
| 6,920,067 B2 | 7/2005 | Hsu et al. | |
| 7,787,304 B2* | 8/2010 | Liu | 365/185.18 |
| 7,898,297 B2* | 3/2011 | Kapoor et al. | 326/98 |
| 2005/0023656 A1 | 2/2005 | Leedy | |

(Continued)

OTHER PUBLICATIONS

Clendenin, Mike; "Flash maker eMemory gaining foundry converts," EE Times Asia, Nov. 6, 2003, 2 pages.

(Continued)

*Primary Examiner* — Alexander H Taningco
*Assistant Examiner* — Christopher Lo
(74) *Attorney, Agent, or Firm* — Law Office of J. Nicholas Gross, P.C.

(57) ABSTRACT

An electronic logic circuit uses areal capacitive coupling devices coupled together to process a set of data inputs. Each areal capacitive coupling device can be configured such that a floating gate potential of such device can be altered to at least a first state or a second state in response to receiving an input signal from the set of data inputs, which is coupled electrically to the floating gate. A majority function logic circuit (and other similar circuits) can be interconnected this way using far fewer gates than with a conventional CMOS implementation. Selective logic gates can also be enabled or disabled by configuring them effectively as memory devices.

20 Claims, 2 Drawing Sheets

Capacitive Coupling Logic Gate

Load line characteristics of the 3-input Capacitive Coupling Device and Pull Down Transistor

(56) References Cited

U.S. PATENT DOCUMENTS

| | | | |
|---|---|---|---|
| 2005/0052926 A1* | 3/2005 | Agata et al. | 365/222 |
| 2005/0146352 A1* | 7/2005 | Madurawe | 326/41 |
| 2005/0169040 A1* | 8/2005 | Peng et al. | 365/149 |
| 2006/0057798 A1 | 3/2006 | Komori et al. | |
| 2006/0067124 A1 | 3/2006 | Lee et al. | |
| 2006/0202719 A1* | 9/2006 | Nakazato | 326/98 |
| 2006/0290382 A1* | 12/2006 | Belluomini et al. | 326/97 |
| 2007/0047302 A1 | 3/2007 | Lee et al. | |
| 2007/0194371 A1 | 8/2007 | Benjamin | |
| 2007/0247902 A1 | 10/2007 | Chen et al. | |
| 2007/0255893 A1 | 11/2007 | Takeuchi | |
| 2008/0186772 A1 | 8/2008 | Horch | |
| 2008/0225593 A1 | 9/2008 | Mitros et al. | |
| 2008/0290386 A1* | 11/2008 | Jenne | 257/298 |
| 2009/0212342 A1* | 8/2009 | Roizin et al. | 257/316 |
| 2009/0315590 A1* | 12/2009 | Yin et al. | 326/119 |

OTHER PUBLICATIONS

Clendenin, Mike; "eMemory extends OTP to 0.15 μm high voltage process," EE Times Asia, Jul. 26, 2006, 1 page.

Datasheet, "Numonyx Embedded Flash Memory(J3vD)," Dec. 2007, 66 pages.

UMC, "Embedded Memory SoC Process Technology," from pdf document created Jul. 21, 2008, 8 pages.

International Search Report and Written Opinion for PCT/US2008/82294, mailed Dec. 19, 2008, 8 pages.

International Search Report and Written Opinion for PCT/US2008/83697, mailed Jan. 9, 2009, 21 pages.

* cited by examiner

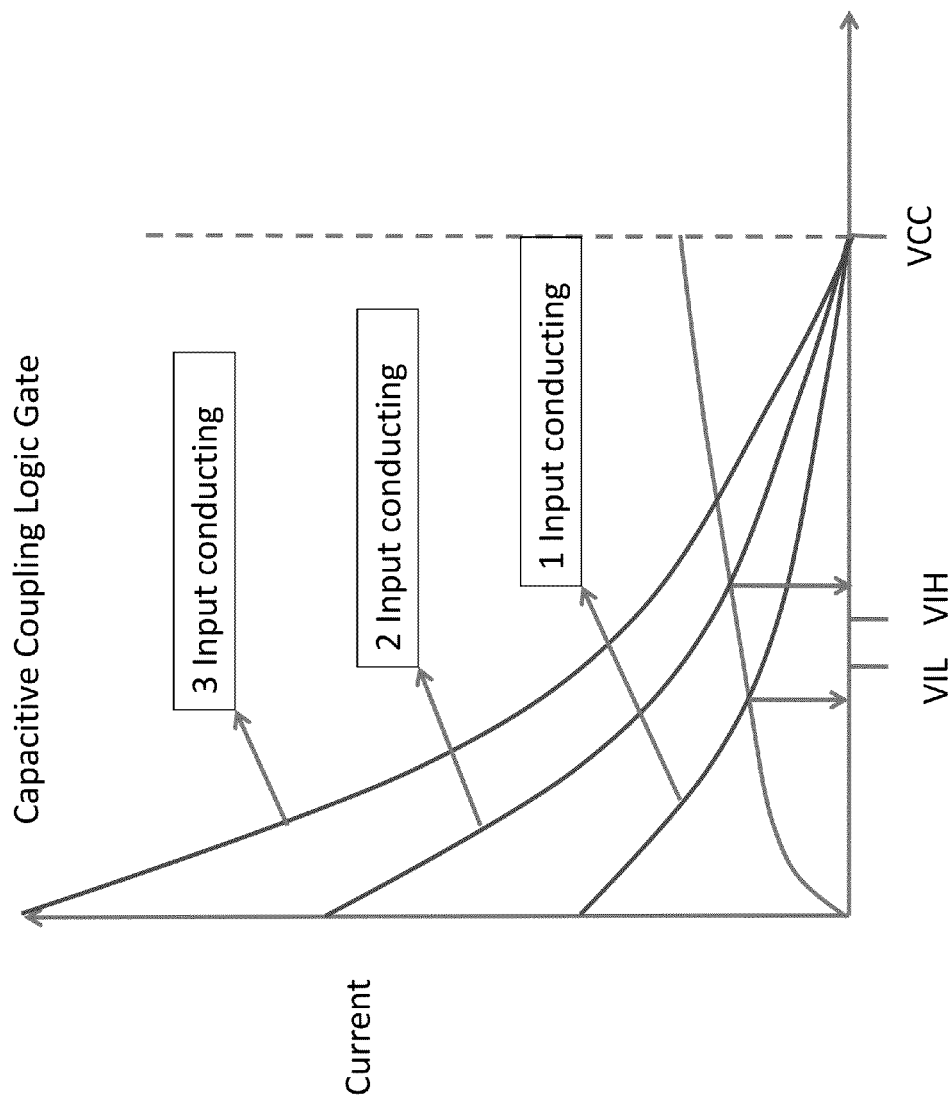
Figure 1: Circuit configuration illustrating a 3-input majority function implementation

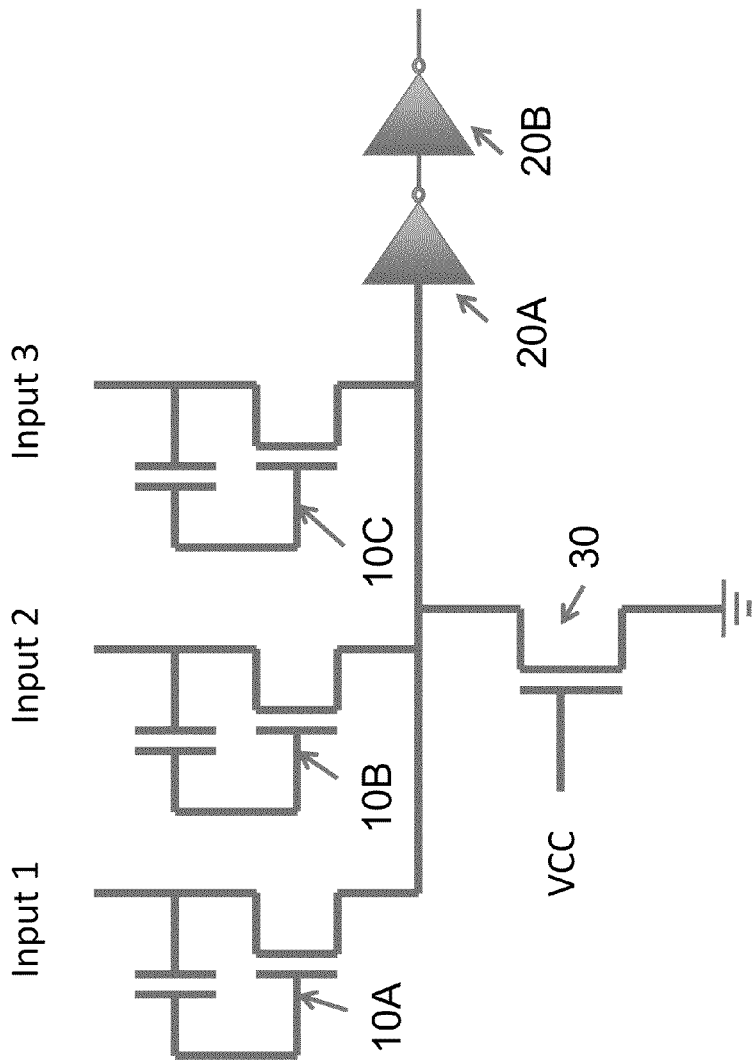
Figure 2: Load line characteristics of the 3-input Capacitive Coupling Device and Pull Down Transistor

US 8,988,103 B2

CAPACITIVELY COUPLED LOGIC GATE

RELATED APPLICATIONS

The present application claims the benefit under 35 U.S.C. 119(e) of the priority date of Provisional Application Ser. No. 61383128 filed Sep. 15, 2010 which is hereby incorporated by reference.

FIELD OF THE INVENTION

The present disclosure pertains to semiconductor logic gates, particularly those which can be implemented using capacitive coupling.

BACKGROUND

Reference is made to U.S. Pat. Nos. 7,782,668 and 7,787,295 and U.S. patent application Ser. Nos. 12/264,029, 12/264,060, 12/264,076, 12/271,647, 12,271,666 and 12/271,680 all of which are hereby incorporated by reference.

The '668 patent discloses a new type of single-poly non-volatile memory device structure that can be operated either as an OTP (one time programmable) or as an MTP (multiple time programmable) memory cell. The device is programmed using hot electron injection. It also has a structure that is fully compatible with advanced CMOS logic process, and would require, at the worst case, very minimal additional steps to implement. Other unique aspects of the device are described in the '668 patent as well.

SUMMARY OF INVENTION

An object of the present invention is to extend the use of capacitive coupling to specific types of logic devices and circuits.

In accordance with this object a plurality of areal capacitive coupling devices are coupled to process a set of data inputs; each is preferably configured such that a floating gate potential of such device can be altered in response to receiving an input signal from the set of data inputs; the floating gate potential can be adjusted to place the areal capacitive coupling device into a first state or a second state through areal capacitive coupling to a potential associated with a first active region receiving the input signal; the areal capacitive coupling devices as interconnected generate a first logic output which is a first logical function associated with the set of data inputs.

Other objects of the invention include methods of operating a dual function gate in which the device performs a different circuit function depending on a level of an input signal applied to such logic gate;

Another object is to provide a logic gate with N inputs and in which a selected set M of inputs (M<=N−2) can be considered for purposes of determining a logical majority function.

A further object is to provide an electronic circuit in which logic gates can also be imbued with a memory function to allow for dual functionality.

DESCRIPTION OF THE DRAWINGS

FIG. 1 depicts a preferred embodiment of a circuit implementing a 3-input majority function.

FIG. 2 depicts the Load Line characteristics of the 3-Input Capacitive Coupling Device and Pull Down transistor shown in FIG. 1.

DETAILED DESCRIPTION

Applicant has discovered that the '668 gate/drain overlap device using areal capacitive coupling (hereinafter referred to as the "capacitive coupling device") can be used in non-memory applications as well. As discussed herein, the device's unique characteristics can be used to efficiently implement a number of CMOS logic functions, including, preferably, one of the most device consuming and yet useful—the Majority Function.

FIG. 1 below illustrates a preferred implementation of a 3-input majority function logic gate 100 implemented with three (3) '668 capacitive coupling devices (shown at the top of the figure as 10A, 10B and 10C) along with standard CMOS transistors (including a pair of inverters on the right—20A/20B, and a conventional N MOS pulldown FET 30) at the bottom). It will be understood by those skilled in the art that other combinations and connections of devices could be used to effectuate the same result of the exemplary gate shown in FIG. 1, including of course for larger numbers of inputs.

The output voltage characteristics, with the capacitive coupling devices as load lines, of the above 3 input circuit is illustrated in FIG. 2. As can be seen from the figure, if 2 or more (a majority) of the inputs to devices 10A/10B/10C are conducting, the intersecting point will yield an output voltage that is higher than the VIH of the inverter circuit (20A/20B), and will allow the output of the voltage after the two inverter stage to be high, fulfilling a majority function.

Conversely, if only one or none of the inputs (not majority) is conducting, the output voltage is below VIL, and will not be able to trigger the inverter. This is how a 3-input majority function is preferably implemented; namely with 3 capacitive coupling devices, 1 pull-down transistor, and 2 pair of NMOS and PMOS transistors for 2 inverter circuits. All of these devices are conventional, and to ensure adequate margin of operation it is preferable to perform simulations to select and match the size of the various transistors. This can be accomplished using any number of well-known design tools, and is commonly done in providing logic cell libraries, so it is well within the skill of the ordinary artisan without undue experimentation.

The transistor count saving, and the subsequent silicon area saving, become geometrically larger when the number of inputs for the majority function increases. For example, for a 5-input majority function, only 5 capacitive coupling devices, 1 matched pull-down transistor, and 2 pair of NMOS and PMOS transistors for 2-stage inverter circuit are required. In general, for any N input majority function gate, the device count will be N capacitive coupling devices and an additional set of 5 support transistors.

One reason that using the capacitive coupling device implementation of a logic gate is advantageous is that a conventional N-channel floating gate device would not be able to turn on if the drain coupling is not high enough to overcome the Vt of the NMOS device. The present device has a high coupling ratio to allow sufficient voltage coupled to the floating gate to turn on the device in accordance with a target/nominal Vt implant process used in the IC manufacturing flow.

Persons skilled in the art will appreciate from the present teachings that the majority function can be implemented in an alternative embodiment in which the invention is taken to an extreme and 100% coupling is used, i.e., such as to effectuate a form of NMOS gated diode (e.g., NMOS with gate connected to the drain directly). The disadvantage of this approach is that it removes one degree of process freedom, in that the only remaining mechanism to control the switching/ output of the device is through adjusting the nominal Vt for the device, a tradeoff that may result in compatibility problems with the CMOS parameters of other devices in the integrated circuit, as well as complicate the matching of the logic circuit output to the pulldown FET characteristics.

A capacitive coupling device implementation with less than 100% coupling offers an advantage over a pure NMOS gated diode implementation, since the output current of the capacitive coupling device can be tailored specifically through the coupling capacitance, without altering the baseline CMOS process parameters (such as Vt) used by other logic circuits, and allowing the logic function to be implemented optimally to other related circuit elements, such as the pulldown FET. Thus the present invention affords a more flexible technique to implement a logic function since a nominal logic gate Vt and related process parameters can be used as a driver to determine sizings of the gates/active regions, and the extent of the coupling ratio ($\forall$) that should be used for any particular circuit.

Other variants of the invention can include hardwired logic (i.e., a PLD, programmable logic) and conventional CMOS logic functions, albeit more efficient in device counts. By allowing embedding of the device within a CMOS process, one can implement a "hardwired" look-up table to implement some logic function, much like an FPGA.

Another advantage of using the preferred embodiment of this invention is that the situation where an input to the majority function may no longer be valid can be addressed with the use of capacitive coupled devices as described in '668. If an input is no longer needed, the associated capacitive coupled device can be programmed to be off and be removed from being considered in the output of the logic function. That is, any one or more of the logic devices in the circuit can be configured effectively by a function select signal. The function select signal can apply a potential to the logic device so that it instead behaves as a quasi-memory device. That is, the device behaves effectively like a memory gate, not a logic gate, when the floating gate is raised to a sufficiently high potential. This has the effect of turning the device off (i.e., rendering it non-conductive) and thus selectively enabling or disabling its participation in a circuit logic function. In some embodiments the output or function can be hardwired or burned in during manufacturing. This can be accomplished by predetermined programming respective inputs to the logic gates, to configure them into an erased or programmed state as desired.

Other variations of circuits of the capacitive coupled dual function devices can be employed of course, and the invention is not limited in this respect. Many types of conventional circuits are expected to benefit from devices which can adjust their behavior dynamically in response to a function select signal.

Thus certain embodiments of the present invention can be implemented so that a majority function circuit can be altered to render a majority function for any subset of the inputs. For example, even with maximum of 5 inputs, one can still program the circuit to be a majority function of any of the 3 inputs. With a set of 7 inputs one can consider the state of a selected subset of 5 inputs, and so on. Other variations will be apparent to those skilled in the art.

This advantageous feature could potentially offer a significant saving in the circuit design since costly revision of the silicon design and its associated process cost can be avoided.

While this preferred example illustrates a majority function logic gate, those skilled in the art will appreciate from the foregoing that this is just an example and that other complex CMOS logic gates can be implemented using the capacitive coupling devices as well. It is expected that the novel capacitive coupling device can be utilized in a number of applications in a non-memory capacity as a substitute for a conventional FET.

What is claimed is:

1. An electronic logic circuit comprising:
   a. a plurality of interconnected two terminal areal capacitive coupling devices coupled to a set of data inputs;
      each of said two terminal areal capacitive coupling devices comprising:
   i) a floating gate; and
   ii) an n-type impurity source coupled to a first terminal; and
   iii) an n-type impurity drain coupled to a second terminal and
   wherein the n-type impurity drain overlaps a sufficient portion of said floating gate and is configured to impart an input signal voltage applied to said second terminal of said n-type impurity drain and said first terminal to said floating gate through areal capacitive coupling and cause each of said areal capacitive coupling devices to be placed into a first state;
   further wherein an output of each two terminal areal capacitive coupling device is related to said first state or said second state, and said plurality of interconnected two terminal areal capacitive devices are configured to generate a plurality of separate outputs;
      said plurality of separate outputs of said plurality of interconnected two terminal areal capacitive coupling devices being adapted to effectuate a collective output corresponding to an output which is a first logical function associated with the set of data inputs applied to said plurality of interconnected two terminal areal capacitive coupling devices.

2. The electronic logic circuit of claim 1, wherein said plurality of interconnected two terminal areal capacitive coupling devices are embedded with other CMOS devices having gates made of a material that is shared with said floating gate.

3. The electronic logic circuit of claim 1, wherein at most N interconnected two terminal areal capacitive coupling devices are included to process N separate and unique inputs.

4. The electronic logic circuit of claim 1, wherein said first logical function is a majority function effectuated on said set of data inputs.

5. The electronic logic circuit of claim 1, wherein said logic function is associated with a value from a lookup table.

6. The electronic logic circuit of claim 1, further including a FET and an inverter stage coupled to said collective output, said FET being configured to drive said inverter stage to a first logical output in response to a first value of said collective output.

7. The electronic logic circuit of claim 1, wherein said plurality of interconnected two terminal areal capacitive coupling devices include a gated diode which has direct coupling of said floating gate to a first active region potential receiving said input signal.

8. A majority function logic circuit comprising:
   a. a plurality of two terminal areal capacitive coupling devices interconnected in parallel to a set of separate data inputs;
      each of said two terminal areal capacitive coupling devices comprising:
   i) a floating gate; and
   ii) an n-type impurity source coupled to a first terminal; and
   iii) an n-type impurity drain coupled to a second terminal and
   wherein the n-type impurity drain overlaps a sufficient portion of said floating gate and is configured to impart an input signal voltage applied to said second terminal of said n-type impurity drain and said first terminal to said floating gate through areal capacitive coupling and cause each of said areal capacitive coupling devices to be placed into a first state;

said plurality of interconnected two terminal areal capacitive coupling devices being adapted to generate an output which is a majority function associated with the set of separate data inputs;

wherein said output has a first logical value when a majority of said set of separate data inputs exceed a predetermined voltage potential, and said output has a second logical value when a majority of said set of separate data inputs does not exceed said predetermined voltage potential.

9. A majority function silicon based semiconductor electronic logic circuit comprising:

a plurality of two terminal areal capacitive coupling devices coupled to process a set of separate data inputs, each of said separate data inputs having at least two distinct logic values, including a first logic value and a second logic value;

each two terminal areal capacitive coupling device being configured to alter a floating gate logic value of such device can be altered in response to receiving an input signal from said set of data inputs;

wherein said floating gate is configured to place a logic value of said two terminal areal capacitive coupling device into a first state or a second state through areal capacitive coupling to a potential associated with a first active region receiving said input signal;

wherein said plurality of two terminal areal capacitive coupling devices are interconnected to generate a collective output which has a first value when a majority of said set of separate data inputs have said first logical value, and said collective output has a second value when a majority of said set of separate data inputs has said second logical value;

the circuit being further configured to reduce a number of valid inputs in the set of data inputs by selectively electrically disabling any two terminal areal capacitive devices representing said invalid inputs.

10. The circuit of claim 9 where the two terminal areal capacitive device representing a given input is subjected to hot electron injection unto the floating gate to cause the input to be disabled by its two terminal areal capacitive device becoming non-conducting.

11. The method circuit of claim 9 where a first subset of the set of data inputs to the majority function electronic logic circuit is processed for a first operation, and a second subset of the set of data inputs is processed for a second operation by the majority function electronic logic circuit.

12. The circuit of claim 9 where the majority function electronic logic circuit can process any selected and enabled subset of available data inputs.

13. The electronic logic circuit of claim 6 wherein said FET has a pulldown characteristic matched to said collective output.

14. The electronic logic circuit of claim 1 wherein an output current of the plurality of interconnected two terminal areal capacitive coupling devices is configured by a coupling capacitance between said floating gate and said n-type impurity drain.

15. The electronic logic circuit of claim 1 wherein the plurality of interconnected two terminal areal capacitive coupling devices are manufactured as part of a CMOS logic process.

16. The electronic logic circuit of claim 1 wherein one of the set of data inputs acts as a function select signal to dynamically adjust behavior of a corresponding two terminal areal capacitive coupling device.

17. The electronic logic circuit of claim 4 wherein a device count used to implement an N input majority function gate is equal to N capacitive coupling devices and an additional set of 5 support transistors.

18. The electronic logic circuit of claim 1 wherein a device count used to implement an N input majority function gate in the electronic logic circuit is equal to N capacitive coupling devices and an additional set of 5 support transistors.

19. The majority electronic logic circuit of claim 8 wherein a device count used to implement an N input majority function gate is equal to N capacitive coupling devices and an additional set of 5 support transistors.

20. The electronic logic circuit of claim 9 wherein a device count used to implement an N input majority function gate is equal to N capacitive coupling devices and an additional set of 5 support transistors.

* * * * *